ELECTRIC WAVE FILTER

Filed Nov. 9, 1948 | 2 SHEETS—SHEET 1

INVENTORS
HECTOR THOMAS PRIOR
THOMAS WILLIAM FISHER
BY Robert Harding Jr.
ATTORNEY

ELECTRIC WAVE FILTER

Filed Nov. 9, 1948 2 SHEETS—SHEET 2

INVENTORS
HECTOR THOMAS PRIOR
THOMAS WILLIAM FISHER
BY
Robert Harding Jr.
ATTORNEY Patented Nov. 25, 1952 2,619,535

UNITED STATES PATENT OFFICE 2,619,535

ELECTRIC WAVE FILTER

Hector Thomas Prior and Thomas William Fisher, London, England, assignors to International Standard Electric Corporation, New York, N. Y.

Application November 9, 1948, Serial No. 59,142
In Great Britain November 21, 1947

5 Claims. (Cl. 178—44)

The present invention relates to improvements in electric wave filters.

The principal object of the invention is to economize the design of filters with very sharp cut-off characteristics.

The object is achieved according to the invention by providing an electric wave filter adapted to pass a specified band of frequencies, comprising one or more crystal element sections connected in tandem, having image impedance of the *m*-derived type, the said crystal element section or sections being terminated at each end by a coil-and-condenser filter network having prototype image impedance facing the crystal element section, the said crystal element section or sections also having a cut-off frequency which lies between the specified frequency band and a corresponding cut-off frequency of the coil-and-condenser filter network.

The principles of electric wave filters are explained in the well-known textbook by T. E. Shea entitled "Transmission Networks and Wave Filters," and the technical terms used in this specification will be found defined therein.

The invention will be described with reference to the accompanying drawings, in which.

Figure 1:
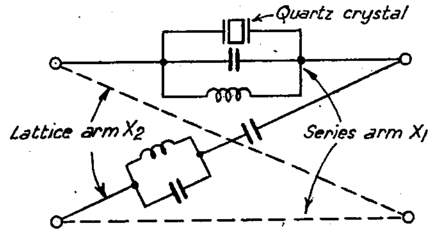
Fig. 1 shows the circuit of a conventional lattice filter section including quartz crystals, the dotted lines indicating the series and lattice arms which are duplications of those shown in detail.

It is well known that in order to produce filters with sharp cut-off characteristics, sections containing quartz crystals may be used. A quartz crystal may be represented by the equivalent electrical circuit consisting of an inductance coil in series with a condenser shunted by a second condenser. The effective Q (or ratio of reactance to resistance) of the coil is normally greater than 10,000, that is to say, of the order of a hundred times greater than the Q of ordinary coils. The inductance of the equivalent coil is very much greater than can be attained with ordinary coils. These two main features coupled with low temperature coefficient and high long-period stability make it possible to meet requirements with crystal filters which are quite out of reach with ordinary elements. Since, however, crystal filters are expensive and difficult to manufacture they are often used in combination with coil and condenser filters, the crystal filters meeting the atttenuation requirements in the neighbourhood of the cut-off frequencies, and the coil and condenser filters meeting the requirements at frequencies well removed from the cut-off frequencies.

To illustrate the manner in which crystal filter sections and coil and condenser sections are commonly combined, it is convenient to take an example. Suppose a low-pass filter is required passing all frequencies up to 99.5 kc./s. with a variation in loss of not more than 0.25 decibel, and attenuating frequencies from 100.5 kc./s. upwards. In order to prevent the dissipation in the coil and condenser part from seriously affecting the pass-band, it is necessary to put the cut-off frequency at about 105 kc./s. This also enables the coil and condenser part to be terminated in an *m* derived type impedance whereas if the cut-off frequency is put much closer to the pass-band it becomes necessary to use a double-*m*-derived type impedance, with a corresponding increase in the number of elements required. It is then necessary to design the crystal filter part to meet the whole of the requirements between 100.5 kc./s. and 105 kc./s. and a part of the requirements, which may be made small, above 105 kc./s. In order to achieve this the cut-off frequency of the crystal filter must be put at about 100 kc./s. Thus the crystal filter must have a loss variation not exceeding 0.25 decibel up to frequencies only 0.5% below the cut-off frequency. This makes it necessary to use the double-*m*-derived type of impedance in order to keep the losses due to reflection and interaction within the permissible limit. Since the coil and condenser sections and the crystal filter sections are designed separately and with different cut-off frequencies and different types of impedance it may be necessary to separate them by a constant resistance attenuation pad in order to avoid large reflection gains in the attenuating range.

The example given illustrates two important points of the conventional type of design. First, it is necessary to use a double-*m*-derived type of impedance for the crystal sections. Second it is likely that a pad may have to be inserted between the crystal and coil and condenser sections.

Figure 2:
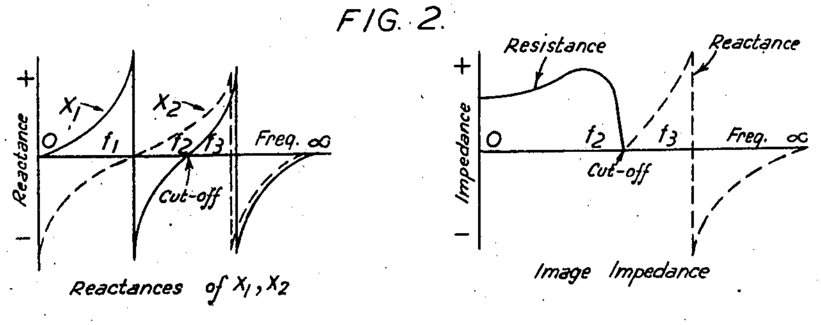
Figs. 2 and 3 show the impedance characteristics of this filter, and the reactance characteristic of its arms.
Figure 3:
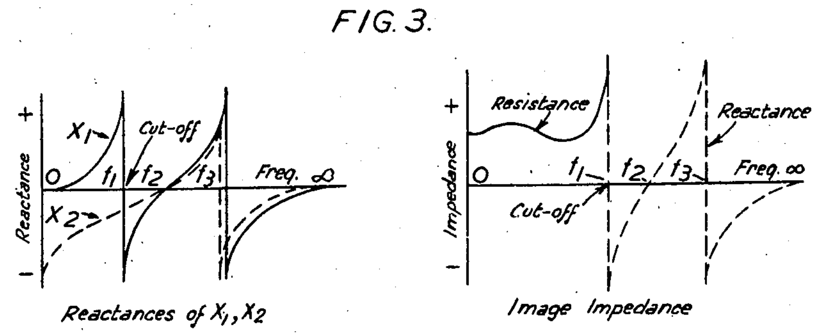

The use of the double-*m*-derived type of impedance instead of the more common *m*-derived type impedance is disadvantageous since for a given number of elements it results in less attenuation being produced. Consider, for example, the lattice type filter section shown in Fig. 1. By suitably proportioning the element this filter section may be given an *m*-derived type impedance or a double-*m*-derived type impedance as shown in Figs. 2 and 3 respectively. Now the section of Fig. 1 will, in general, have three peak frequencies in the attenuating range, that is to say, three frequencies of infinite loss. The nature of these peaks will, however, differ according to the type of impedance used. Thus for the arrangement of Fig. 2 giving the *m*-derived type impedance, two of the peaks will be dependent on the propagation constant, which is a function of $X1/X2$, where $X1$ and $X2$ are the reactances of the arms of the lattice, and the third will be dependent on the image impedance, which is a function of $X1$, $X2$. The peaks dependent on $X1/X2$ are known as attenuation peaks, and the peaks dependent on $X1$, $X2$ are known as reflection peaks. For the arrangement shown in Fig. 3, however, one of the peaks is dependent on the propagation constant and the other two are dependent on the image impedance. Now if a number of sections having the same image impedance are added together in the usual way, their reflection peaks, which are dependent only on image impedance will all occur at the same frequency. Furthermore, since there will be no mismatch between sections, the combination will have the same reflection losses as any one section, that is to say the reflection peaks of the individual sections will not be additive. It is a further property of reflection peaks that they are much sharper than attenuation peaks, the loss dropping rapidly on each side of the peak frequency.

If a table is made giving the number of attenuation peaks and the number of reflection peaks produced by various numbers of sections of the type, shown in Fig. 1 having *m*-derived and double-*m*-derived type impedance, the advantage of the *m*-derived type is at once apparent.

*Table*

| No. of sections | | 1 | 2 | 3 | 4 |
|---|---|---|---|---|---|
| Type of impedance | Type of peak | | | | |
| *m* | Attenuation | 2 | 4 | 6 | 8 |
| | Reflection | 1 | 1 | 1 | 1 |
| Double-*m* | Attenuation | 1 | 2 | 3 | 4 |
| | Reflection | 2 | 2 | 2 | 2 |

It should be pointed out at this stage that since all practical crystal filters are of the lattice or bridged-T form, they are symmetrical networks and have the same type of impedance at each end. Thus the difficulty cannot be avoided by the use of half-sections having different impedance at the two ends as is commonly done with ladder type coil and condenser filters.

The other disadvantage of the conventional method of design is the possibility of high reflection gain in the attenuating range due to the absence of any particular relation between the image impedance of the crystal and coil and condenser parts. If, for example, the two image impedances at some frequency are equal and opposite (in the attenuating range they will both be reactive), then at this frequency the overall loss will become theoretically zero however much attenuation each part has separately. In practice the effect is diminished by dissipative effects in the components but very large reductions in loss can occur. The difficulty can be got over by putting an attenuating resistance pad between the two parts, 2 or 3 decibels usually being sufficient, but the increase in basic loss is in general undesirable and often quite impermissible.

Having explained the difficulties associated with the conventional filter, the manner of treating filters according to the present invention will be described.

In these filters, crystal sections with *m*-derived type impedances are used where double-*m*-derived type impedances would previously have been required, thus securing the advantage demonstrated in the above table. The image impedances of the crystal filter sections and the coil and condenser sections are also related in such a way that high reflection gains in the attenuating range cannot occur. Thus no pads need be inserted and the basic loss can be kept down to minimum.

As an example of the invention, the design of a low pass filter will be described, but the principles are the same for high pass filters or band pass filters.

Figure 4:
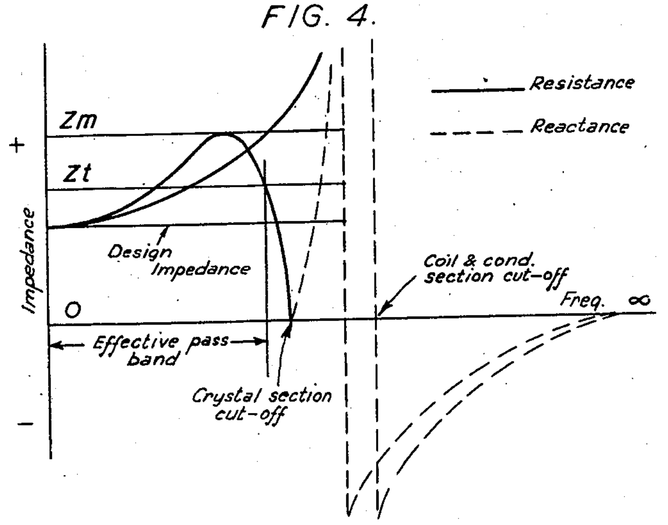
Fig. 4 shows an impedance diagram used in explaining the manner of designing a filter according to the invention.

The basis of the design is to relate the image impedances of the two parts at their junction in the manner shown in Fig. 4. The image impedance of the crystal part is made mid-series *m*-derived type in the case shown, and the image impedance of the coil and condenser part is made midshunt prototype. The cut-off frequency of the coil and condenser section is chosen to be somewhat higher than that of the crystal section, so that the cut-off frequency of the crystal sections lies between the pass band and the cut-off frequency of the coil and condenser section. By choosing suitable values for *m* and for the ratio of the two cut-off frequencies very close matching between the two image impedances can be secured up to frequencies within less than 0.5% of the crystal filter cut-off. Fig. 4 shows that at no point can large reflection gains occur at the junction since where both image impedances are reactive they are always of the same sign. It is obvious that the same relations will hold for mid-shunt *m*-derived type crystal sections with mid-series prototype coil and condenser sections and that there will be corresponding relations for high-pass and band-pass filters.

Figure 5:
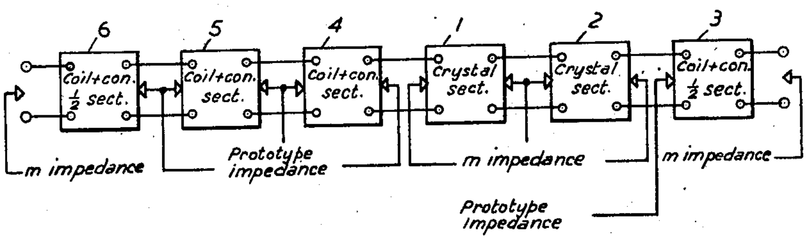
Fig. 5 shows an example of a filter according to the invention.

It will be found, as shown in the numerical example given below, that in practical cases the cut-off frequency of the coil and condenser sections is sufficiently far above the crystal section cut-off frequency to enable the coil and condenser sections to be terminated with an *m*-derived type impedance at the ends not facing the crystal section. Thus, a typical arrangement of sections would be as shown in Fig. 5. It is evident that any number of sections of either type could be added together in this manner.

In Fig. 5 there are two crystal sections 1, 2 according to Fig. 1, for example, designed with *m*-derived type impedance, terminated at one end by a half-section 3 of a ladder type coil and condenser filter having prototype impedance facing the section 2 and *m*-type impedance at the other end. The other end of the crystal filters is terminated by two coil and condenser ladder sections 4 and 5 having prototype impedance, and a half coil and condenser ladder section 6 with prototype impedance facing the section 5 and *m*-derived type impedance at the other end.

Fig. 5 is only one example of a filter according to the invention, and not all the sections shown are essential. In its simplest form, the filter would consist only of the sections 6, I and 3.

The following explanation of the design procedure will be given for the low-pass case illustrated in Fig. 4, but as already mentioned the theory of all other cases will follow similar lines.

It will be asumed that the following information is given.

1. The frequency range and permissible variation of loss within the pass-band.

2. The frequency range and minimum loss requirements within the stop-band.

The design steps are then as follows:

*Step 1.*—Decide on the cut-off frequency of the crystal filter sections. There can be no hard and fast rule about this choice. It is necessary for the designer to view the requirements in the light of previous experience. This first step is not, of course, a particular feature of the invention but occurs in the design of any filter.

*Step 2.*—Decide on the $m$ value for the crystal sections by considerations of the pass-band requirements. Since crystal sections are being considered the effects of dissipation may be neglected as in all useful types of section dissipation is either negligible or causes a constant basic loss. Thus, so far as variations of loss are concerned only reflection loss and interaction loss need be considered. Now it can be shown that when reflection loss is small (less than one decibel for example) the interaction loss (which may be positive or negative), can either reduce the total loss to zero, or increase it to an amount approximating closely to double the reflection loss. The maximum possible variation of loss therefore, is to a close approximation, twice the total reflection loss. As reflection loss occurs at both ends it is convenient to consider that the maximum possible variation of loss is equal to four times the reflection loss at one end. The maximum permissible mismatch at one end can therefore be calculated very easily from the maximum permissible loss variation. From Fig. 4, it may be seen that to a close approximation the maximum mismatch may be taken as the square root of the ratio of the maximum impedance of the crystal section $Z_m$ to the impedance at the highest frequency of interest $Z_t$. The cut-off frequency having been settled in Step 1 and the highest frequency of interest being given, the value of $m$ can now be found which gives the ratio $Zm/Zt$ the desired value.

It will become apparent in the next step that by taking full advantage of the maximum permissible loss variation in the pass-band, the cut-off frequency of the coil and condenser section is kept the maximum distance from the cut-off frequency of the crystal section.

*Step 3.*—Fix the position of the cut-off frequency of the coil and condenser section. This may be done by simply choosing the cut-off frequency which gives the best fit between the two image impedances. A good approximation is to allow the maximum mismatch ratio to occur at the frequency of maximum impedance of the crystal section.

Figure 6:
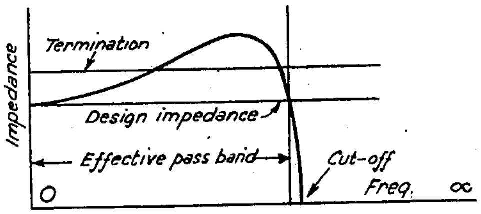
Fig. 6 shows an impedance diagram used in explaining the design of the coil and condenser sections of the filter.

*Step 4.*—Fix the $m$ value of the coil and condenser terminations. It can be shown that the best arrangement is as shown in Fig. 6 where the impedance at the top frequency of interest is made equal to the nominal impedance and the constant terminating resistance is made equal to the geometric mean of the nominal impedance and the maximum impedance. In most practical cases the variation in loss caused by the mismatch in this part of the circuit will be negligible. Should the effect be appreciable however, it would be necessary to start again at Step 2, allowing sufficient margin for the additional variations.

A numerical example of the design of a filter according to the invention will now be given.

Consider the example already quoted, that is to say a low-pass filter passing frequencies up to 99.5 kc./s. with a variation in loss of not more than 0.25 db. and attenuating frequencies from 100.5 kc./s. upwards.

Using conventional methods, a double-$m$-derived type impedance would be needed, as with an $m$-derived type impedance the best that could be done would be a variation in loss of about 0.6 decibel.

Using a filter according to the invention, it will be found that a variation of loss of less than 0.25 decibel can be obtained with the following parameters:

Crystal section cut-off frequency=100 ks./s.
Crystal section $m$ value=0.14
Coil and condenser cut-off frequency=105 kc./s.
Coil and condenser m value=0.43.

A slightly better result could be obtained by making the nominal impedances of the crystal sections and coil and condenser section different. Thus, referring to Fig. 4, if the nominal impedance of the coil and condenser section is made higher than that of the crystal section, the two image impedances which it is desired to match can be made equal at two frequencies. The maximum mismatch will then occur at three frequencies viz zero frequency, the top frequency of the pass-band and a frequency just below the frequency of maximum impedance of the crystal section. If the mismatch at each of these three points is made the same then the best possible arrangement will have been obtained. The use of different nominal impedances for the two types of section gives a small advantage in practice and might not justify the trouble of taking it into account so far as improvement in loss variation is concerned. It is however useful as an extra degree of freedom and allows the cut-off frequency and peak loss frequency of the coil and condenser section to be varied over a limited range. As a rough guide it may be said that raising the nominal impedance of the coil and condenser section relative to that of the crystal section enables the coil and condenser cut-off frequency to be made higher relative to the crystal cut-off frequency.

What is claimed is:

1. An electric wave filter adapted to pass a specified band of frequencies, comprising a crystal element section having image impedance of the $m$-derived type, two coil-and-condenser filter networks having prototype image impedance facing the crystal element section one connected to each end of the crystal element section, said crystal element section being selected to have cut-off frequency which lies between the specified frequency band and a corresponding cut-off frequency of the coil-and-condenser filter networks.

2. A filter according to claim 1 in which the crystal element section has a nominal image impedance different from the nominal prototype impedance of the coil-and-condenser filter networks.

3. A filter according to claim 1 in which at least one of said coil-and-condenser filter networks is a half section having $m$-derived type impedance at the end remote from the crystal section.

4. A filter according to claim 1 further comprising a coil-and-condenser ladder half section having $m$-derived type impedance at one end and prototype impedance at the other, a coil and condenser ladder section having prototype impedance at both ends connected to said other end of said ladder half section, a crystal ladder section having $m$-derived type impedance connected to said ladder section, and a second coil and condenser ladder half section having prototype impedance at one end and $m$-derived type impedance at the other end and having said one end connected to said crystal lattice section.

5. An electric wave filter comprising a plurality of filtering sections connected in tandem, said filtering sections including a first crystal element section and a second crystal element section connected in series, each having image impedance of the $m$-derived type, a first coil-condenser filter network section and a second coil-condenser filter network section connected together in series with the second coil-condenser section connected in series to said first crystal section, each coil-condenser section having prototype image impedance, and two coil-condenser ladder half sections having $m$-derived type impedance, one each connected to said second crystal section and said first coil-condenser section.

HECTOR THOMAS PRIOR.
THOMAS WILLIAM FISHER.

REFERENCES CITED

The following references are of record in the file of this patent:

UNITED STATES PATENTS

| Number | Name | Date |
| --- | --- | --- |
| 1,969,571 | Mason | Aug. 7, 1934 |
| 1,976,481 | Castner | Oct. 9, 1934 |
| 2,045,991 | Mason | June 30, 1936 |
| 2,070,677 | Norton | Feb. 16, 1937 |
| 2,216,937 | Ciccolella | Oct. 8, 1940 |